United States Patent
Joyce

(10) Patent No.: US 10,233,076 B2
(45) Date of Patent: Mar. 19, 2019

(54) TRANSDUCER ARRAY SUBDICING

(71) Applicant: uBeam Inc., Santa Monica, CA (US)

(72) Inventor: Andrew Joyce, Venice, CA (US)

(73) Assignee: uBeam Inc., Marina Del Rey, CA (US)

( * ) Notice: Subject to any disclaimer, the term of this patent is extended or adjusted under 35 U.S.C. 154(b) by 256 days.

(21) Appl. No.: 15/154,896

(22) Filed: May 13, 2016

(65) Prior Publication Data

US 2016/0339475 A1  Nov. 24, 2016

Related U.S. Application Data

(60) Provisional application No. 62/164,108, filed on May 20, 2015.

(51) Int. Cl.
| | | |
|---|---|---|
| H01L 41/09 | (2006.01) | |
| B81B 7/00 | (2006.01) | |
| H01L 41/338 | (2013.01) | |

(52) U.S. Cl.
CPC .......... *B81B 7/0064* (2013.01); *H01L 41/338* (2013.01)

(58) Field of Classification Search
CPC ............................. B81B 7/0064; H01L 41/338
USPC .......................... 310/311, 328, 330–332, 348
See application file for complete search history.

(56) References Cited

U.S. PATENT DOCUMENTS

| | | | |
|---|---|---|---|
| 6,359,375 B1 | 3/2002 | Guo et al. | |
| 9,615,452 B1 * | 4/2017 | Western | H05K 1/09 |
| 2001/0032382 A1 | 10/2001 | Lorraine et al. | |
| 2005/0168102 A1 * | 8/2005 | Matsumoto | H03H 3/04 |
| | | | 310/312 |
| 2005/0255668 A1 | 11/2005 | Tseng et al. | |
| 2015/0045671 A1 | 2/2015 | Ozawa | |
| 2016/0244325 A1 * | 8/2016 | Cheng | B81B 7/02 |
| 2016/0272486 A1 * | 9/2016 | Shin | B81B 7/02 |
| 2016/0332867 A1 * | 11/2016 | Tseng | B81B 7/02 |
| 2016/0339476 A1 * | 11/2016 | Joyce | B06B 1/0666 |
| 2016/0339628 A1 * | 11/2016 | Joyce | B06B 1/0666 |
| 2016/0340178 A1 * | 11/2016 | Joyce | F16B 11/006 |
| 2017/0001860 A1 * | 1/2017 | Chu | H01L 24/18 |
| 2017/0265308 A1 * | 9/2017 | Nemeth | H05K 3/0026 |

OTHER PUBLICATIONS

Invitation to Pay Additional Fees issued in PCT/US2016/033369 on Jul. 19, 2016.

(Continued)

*Primary Examiner* — Thomas Dougherty
(74) *Attorney, Agent, or Firm* — Morris & Kamlay LLP

(57) ABSTRACT

Systems and techniques are provided for transducer array subdicing. A laminate material may include two laminate material flexures which each have a flexure boundary defined by a gap in the piece of laminate material. A trench may be located between the two flexures. The trench may be defined by a removal of a portion of laminate material from the piece of laminate material. A second trench may be on an opposite surface of the piece of laminate material from the trench. The second trench may be partially aligned with the trench. The trench and the second trench may result from the removal of laminate material from the piece of laminate material to a depth of 20% to 60% of the thickness of the piece of laminate material.

14 Claims, 7 Drawing Sheets

(56) References Cited

OTHER PUBLICATIONS

Cortes et al. "Elastic guided wave propagation in a periodic array of multi-layered piezoelectric plates with finite cross-sections" Ultrasonics, vol. 50 Issue 3 (Mar. 2010): pp. 347-356.
Qi et al "Finite Element Study on 1-D Array Transducer Design" IEEE Transactions on Ultrasonics. Ferroelectrics, and Frequency Control, vol. 47 Issue 4 (Jul. 2000)• pp. 949-955.
Janjlc et al. "Improving the Performance of a 1-D Ultrasound Transducer Array by Subdicing"—IEEE Transactions on Ultrasonics, Ferroelectrics, and Frequency Control, vol. 63 Issue 8 (Aug. 2016) pp. 1161-1171.
Janjic el al. "Quantifying the effect or subdicing on element vibration in ultrasound transducers" Ultrasonics Symposium (IUS), 2015 IEEE International (Oct. 21, 2015).
International Search Report and Written Opinion issued in PCT/US2016/033369 dated Sep. 30, 2016.

* cited by examiner

TRANSDUCER ARRAY SUBDICING

CROSS REFERENCE TO RELATED APPLICATIONS

This application claims priority to U.S. Provisional Patent Application No. 62/164,108, filed on May 20, 2015.

BACKGROUND

A transducer may be used to generate soundwaves, including ultrasonic sound waves, through mechanical vibration. An array of transducers may include a number of transducers in close proximity to one another. The transducers may operate at the same time, generating sound waves having various phase and amplitude differences. Maintaining phase differences among transducers in an array may allow for the steering of a beam or wave front output by the array.

BRIEF SUMMARY

According to an implementation of the disclosed subject matter, a laminate material may include two laminate material flexures which each have a flexure boundary defined by a gap in the piece of laminate material. A trench may be located between the two flexures. The trench may be defined by a removal of a portion of laminate material from the piece of laminate material.

A second trench may be on an opposite surface of the piece of laminate material from the trench. The second trench may be at least partially aligned with the trench. The trench and the second trench may each result from a removal of laminate material from the piece of laminate material to a depth of 20% to 60% of the thickness of the piece of laminate material. A total removal of laminate material in an area where the trench and the second trench are aligned may be to a depth of less than 100% of the thickness of the piece of laminate material.

A portion of the laminate material with a thickness at least 20% of the thickness of the piece of laminate material may remain located between the trench and the second trench. The trench may result from a removal of laminate material from the piece of laminate material to a depth of 100% of the thickness of the substrate.

A substrate may include two or more cavities in a material of the substrate. A trench may be located in between two of the two or more cavities. The trench may result from the removal of a portion of the material of the substrate from the substrate.

A second trench may be on an opposite surface of the substrate material from the trench. The second trench may be at least partially aligned with the trench. The trench and the second trench each may result from a removal of material from the substrate to a depth of 20% to 60% of the thickness of the substrate. A total removal of material from the substrate in an area where the trench and the second trench are aligned may be to a depth of less than 100% of the thickness of the substrate.

A portion of the substrate with a thickness at least 20% of the thickness of the substrate may remain located between the trench and the second trench. The trench may result from a removal of material from the substrate to a depth of 100% of the thickness of the substrate. Additional trenches may be located on the substrate between at least two of the two or more cavities.

Systems and techniques disclosed herein may allow for transducer array subdicing. Additional features, advantages, and embodiments of the disclosed subject matter may be set forth or apparent from consideration of the following detailed description, drawings, and claims. Moreover, it is to be understood that both the foregoing summary and the following detailed description are examples and are intended to provide further explanation without limiting the scope of the claims.

BRIEF DESCRIPTION OF THE DRAWINGS

The accompanying drawings, which are included to provide a further understanding of the disclosed subject matter, are incorporated in and constitute a part of this specification. The drawings also illustrate embodiments of the disclosed subject matter and together with the detailed description serve to explain the principles of embodiments of the disclosed subject matter. No attempt is made to show structural details in more detail than may be necessary for a fundamental understanding of the disclosed subject matter and various ways in which it may be practiced.

DETAILED DESCRIPTION

Figure 1:
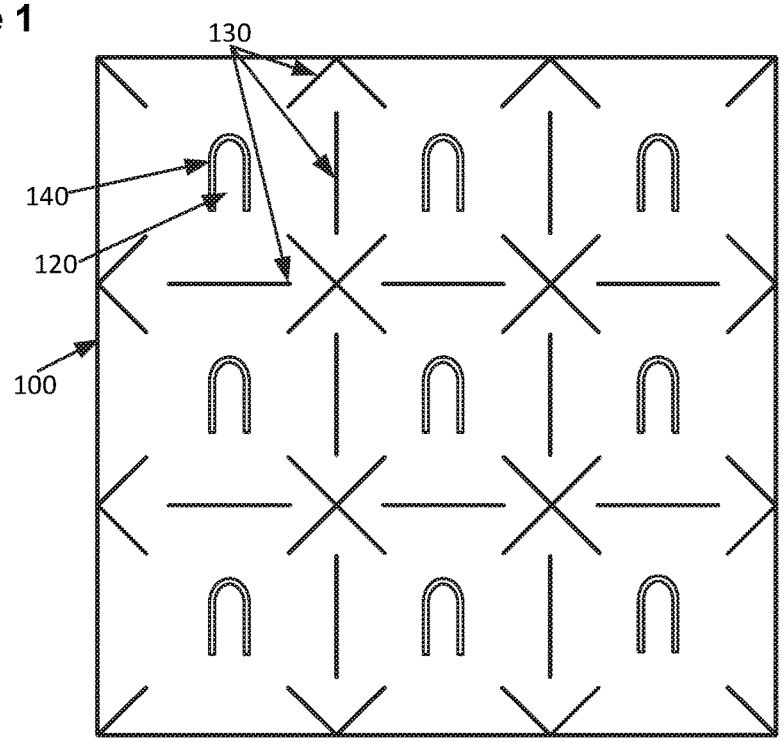
FIG. 1 shows an example laminate material according to an implementation of the disclosed subject matter

Subdicing may be used on an array of transducers. The subdicing may create trenches or separations between the individual transducers of the array, and may be any suitable form of cutting, dicing, ablation, or other type of removal, of a material or substrate of the array. Subdicing the array of transducers may isolate proximate transducers from each other in order to reduce crosstalk between neighboring transducers that may develop based on vibrations being transmitted through the material or substrate of the array. This may reduce coupling between transducers, allowing for control of the phases of the sound waves generated by the transducers of the array.

An array of transducers may be an acoustic phased array, and may include a number of transducers. The transducers may be, for example, ultrasonic transducers which may include an electromechanically active device. The electromechanically active device may be, for example, a piezoceramic flexure which may be vibrate when subject to alternating current. The piezoceramic flexures for an array of transducers may be created within a laminate material that includes a piezoceramic layer bonded to a conductive substrate, such as, for example, aluminum, stainless steel, or brass. The piezoceramic flexures may be created by removing portions of the laminate material in a U-shape, or other suitable, non-closed, shape, leaving a piezoceramic flexure that remains connected to the rest of the laminate material.

Multiple piezoceramic flexures may be created within the same piece of laminate material. To create an array of transducers, the laminate material may be attached to a substrate, such as, for example, a PCB, which may have a number of cavities. The cavities may be aligned with the piezoceramic flexures created in the laminate material to form transducers. For example, each piezoceramic flexure of the laminate material may be able to move downwards into one of the cavities in the substrate. Electrical conduction between the transducers may be possible through the laminate material. For example, the transducers may be single-ended and may share a common ground. In some implementations, the piezoceramic flexures may be bimorphs, created from a laminate material which includes bonded piezoceramic layers.

The laminate material may be subdiced before being attached to the substrate to create an array. The subdicing may be performed in any suitable manner, including, for example, through laser ablation of the laminate material, or use of a dicing saw or CNC mill. The subdicing may remove material around each of the piezoceramic flexures of the laminate material. Any suitable subdicing pattern may be used in the removal of material in order to acoustically isolate each of the piezoceramic flexures from the proximate piezoceramic flexures of the laminate material. A subdicing pattern may include any combination of any suitable shapes created through removal of the laminate material. A subdicing pattern may be used on a piece of laminate material by applying the same pattern of laminate material removal around each piezoceramic flexure of the laminate material, resulting in a pattern of laminate material removal repeated for each piezoceramic flexure. In some implementations, a subdicing pattern may use different patterns of laminate material removal around piezoceramic flexures of the same piece of laminate material, or may use patterns repeat across more than one piezoceramic flexure. A subdicing pattern may be designed to allow the transducers to remain electrically connected through the laminate material while disrupting the propagation of surface waves, such as Lamb waves, through the laminate material. The disruption of the propagation of surface waves through the laminate material may prevent coupling of the flexures when they are used as part of an array of transducers which may, for example, generate ultrasonic soundwaves.

For example, a subdicing pattern may include the removal of laminate material in a connected or disconnected square around each piezoceramic flexure, with sides of the connected or disconnected square being shared by neighboring piezoceramic flexures. A disconnected square may include four sides, but adjacent sides of the disconnected square may not meet to form corners. At the locations where the corners of the disconnected squares would have been were the disconnected square connected, laminate material may be removed in a cross pattern, or X shape, or in any other suitable shape, such as, for example, a T-shape or circle. An X-shape may be positioned such that the legs of the X are along the diagonals of the disconnected squares, or in any other suitable manner. Other shapes may be positioned in suitable manners. At the edges of the piece of laminate material, laminate material may be removed in a V shape, or in any other suitable shape, in a similar manner. A fully connected square may include four sides which may meet to form corners and may or may not have additional shapes located at the corners.

Subdicing may remove any suitable amount of laminate material, forming trenches in the laminate material. For example, each line of the disconnected squares, and the X and V shapes, or other shapes, may be made by removing laminate material to a depth of 40% of the thickness of the laminate material, forming a trench. The laminate material may be removed to any suitable depth, such as, for example, between 20% and 60% of the thickness of the laminate material, and different depths may be used for different parts of a subdicing pattern on the same piece of laminate material. Any suitable width of the laminate material may be removed.

Both sides of the laminate material may be subdiced. For example, the same subdicing pattern may be used on both sides of a piece of a laminate material, resulting in trenches on either side of the laminate material that are aligned. Laminate material may be removed to the same depth on both sides of the laminate material, or may be removed to different depths. For example, a trench for a side of a disconnected square may be made on both sides of the laminate material through removing laminate material to a depth of 40% on one side of the laminate material and 40% on the other side of the laminate material, leaving a portion of the laminate material that is 20% of the thickness of the laminate material. A trench for a side of a disconnected square may be created on both sides of the laminate material through removing laminate material to a depth of 60% on one side of the laminate material and 20% on the other side of the laminate material, leaving a portion of the laminate material that is 20% of the thickness of the laminate material in between the two trenches on opposite sides of the laminate material.

In some implementations, the subdicing may remove laminate material through the entire thickness of the laminate material. This may result in the piezoceramic flexures being fully separated within the laminate material. For example, the laminate material may be attached to another material, such as the top layer of a PCB, before being subdiced, and the subdicing may separate the piezoceramic flexures down to the top layer of the PCB.

The transducers in the array of transducers may include electromechanically active devices, such as piezoceramic flexures, attached to a wall of a cavity in a substrate. The substrate may be, for example, a layer of a PCB. The electromechanically active device may be a cantilever or flexure, and may be, for example, a piezoceramic unimorph or bimorph. For example, the electromechanically active devices may be piezoceramic flexures created from a laminate material. The cavity may be any suitable shape and depth. For example, the cavity may be circular. The cavity may be created in the substrate in any suitable manner, including through subtractive processes, such as drilling, or additive processes. The electromechanically active device may be attached to the wall of the cavity in any suitable manner. For example, a step structure may be created on an edge of the cavity, and the electromechanically active device may be bonded to the step structure using any suitable adhesive, such as, for example, conductive epoxy. The electromechanically active device may be any suitable length and width for vibration at ultrasonic frequencies, and may be oriented in the cavity at any suitable angle. For example, the electromechanically active device may reach approximately halfway across the cavity. The top surface of the electromechanically active device, which may be, for example, a passive material of a unimorph or an active material of a bimorph, may be level, or near-level, with the top of the cavity. In some implementations, a transducer may include more than one electromechanically active device within a cavity.

The substrate of the array of transducers may be subdiced. For example, material may be removed from the substrate based on any suitable subdicing pattern. The subdicing may be performed in any suitable manner, including, for example, through laser ablation of the laminate material, or use of a dicing saw or CNC mill. The subdicing may remove material around the location, or future location, of each of the cavities in the substrate. Any suitable subdicing pattern may be used in the removal of material in order to acoustically isolate each of the electromechanically active devices from the electromechanically active devices of proximate cavities in the substrate. A subdicing pattern may include any combination of any suitable shapes created through removal of material from the substrate. A subdicing pattern may be used on a substrate by applying the same pattern of removal of material from the substrate around each location of a cavity in the substrate, resulting in a pattern of removal of material from the substrate repeated for each cavity. In some implementations, a subdicing pattern may use different patterns of removal of material from the substrate around cavities of the same substrate, or may use patterns repeating across more than one cavity of the same substrate. A subdicing pattern may be designed to disrupt the propagation of surface waves, such as Lamb waves, through the substrate. The substrate may be subdiced before or after the electromechanically active devices are attached to the cavity walls, and before or after the cavities are created in the substrate.

For example, a subdicing pattern may include the removal of material from the substrate in a connected or disconnected square around each cavity, with sides of the connected or disconnected square being shared by neighboring cavities. The disconnected square may include four sides, but adjacent sides of the disconnected square may not meet to form corners. At the locations where the corners of the disconnected squares would have been were the disconnected square connected, material from the substrate may be in a cross pattern, or X shape, or in any other suitable shape, such as, for example, a T-shape or circle. An X-shape may be positioned such that the legs of the X are along the diagonals of the disconnected squares, or in any other suitable manner. Other shapes may be positioned in suitable manners. At the edges of the substrate, material may be removed in a V shape, or any other suitable shape, in a similar manner. A fully connected square may include four sides which may meet to form corners and may or may not have additional shapes located at the corners.

Subdicing may remove any suitable amount of material from the substrate, forming trenches in the substrate. For example, each line of the disconnected squares, and the X and V shapes, or other shapes, may be made by removing material from the substrate to a depth of 40% of the thickness of the substrate, forming a trench. The material from the substrate may be removed to any suitable depth, such as, for example, between 20% and 60% of the thickness of the substrate, and different depths may be used for different parts of a subdicing pattern on the same substrate. Any suitable width of the substrate may be removed.

Both sides of the substrate may be subdiced. The substrate may be, for example, a layer of PCB substrate that is separated from a PCB onto which the substrate may later be attached. This may allow for subdicing of both sides of the substrate. For example, the same subdicing pattern may be used on both sides of a substrate, resulting in trenches on either side of the substrate that are aligned. Material from the substrate may be removed to the same depth on both sides of the substrate, or may be removed to different depths. For example, a side of a disconnected square may be made on both sides of the substrate through removing material from the substrate to a depth of 40% on one side of the substrate and 40% on the other side of the substrate, leaving a portion of the substrate that is 20% of the thickness of the substrate. A trench for a side of a disconnected square may be made on both sides of the substrate, through removing material from the substrate to a depth of 60% on one side of the substrate and 20% on the other side of the substrate, leaving a portion of the substrate that is 20% of the thickness of the substrate in between the two trenches on opposite sides of the substrate. After both sides of the substrate are subdiced, the substrate may be attached to a PCB which may include circuitry and electronics for operation of the array of transducers.

In some implementations, the subdicing may remove material from the substrate through the entire thickness of the substrate. This may result in the cavities, and electromechanically active devices, being fully separated within the substrate. For example, the substrate may be attached to another material, such as a top or second layer of a PCB, before being subdiced, and the subdicing may separate the piezoceramic flexures down to the top or second layer of the PCB.

In some implementations, subdicing patterns may be created using non-mechanical processes, or using non-subtractive processes. For example, a substrate with subdicing patterns may be created through 3-d printing, molding, or vacuum forming, of the substrate, or through chemical subtractive or additive processes.

FIG. 1 shows an example laminate material according to an implementation of the disclosed subject matter. The laminate material 100 may be laminate made by bonding a layer of an electrically active material, such as a piezoceramic material, to a layer of an electrically passive, conductive, material, such as metal, including, for example, aluminum, stainless steel, or brass. The layers may be bonded in any suitable manner, for example, using any suitable adhesive or epoxy, or any other bonding technique or material. Flexures 120 may be created in the laminate material 100 through removal of portions of the laminate material 100 in any suitable shape, such as U shape, resulting in gaps 140 between flexures 120 and the rest of the laminate material 100. Each of the gaps 140 define a boundary for each of the flexures 120. The flexures 120 may remain connected to the rest of the laminate material 100 while having free ends that can move independently of the rest of the laminate material 100. The gap 140 may be the result of the removal of portions of the laminate material 100 through the entire thickness of the laminate material 100, and may be created in any suitable manner, such as, for example, through laser ablation, with a CNC mill, or through the use of any other suitable device for removing portions of the laminate material 100.

The laminate material 100 may be subdiced. The subdicing pattern may include any suitable number of trenches 130, which may be created through removal of portions of the laminate material 100. The portions of the laminate material 100 may be removed in any suitable manner to create the trenches 130, including, for example, through laser ablation, with a CNC mill or dicing saw, or with any other suitable device for removing portions of the laminate material 100. The trenches 130 may be created through removal of portions of the laminate material 100 to any suitable depth, such as, for example, between 20% and 60% of the depth of the laminate material 100.

The trenches 130 may be arranged in any suitable manner on the laminate material 100 in accordance with any suitable subdicing pattern. For example, the trenches 130 may form disconnected squares around each of the flexures 120, with additional trenches 130 forming cross patterns, or X shapes, centered on the corners where the trenches 130 of the disconnected squares would meet were they were extended. The trenches 130 of the cross patterns may be angled relative to the trenches that form the disconnected squares. The subdicing pattern may be repeated for each of the flexures 120 of the laminate material 100, with suitable modifications at the edges of the laminate material 100. For example, at an edge of the laminate material 100, only half of the trenches 130 for a cross pattern may be used, forming a V shape. The trenches 130 may disrupt the propagation of surface waves through the laminate material 100, which may prevent coupling of the flexures 120 when they are used as part of an array of transducers which may, for example, generate ultrasonic soundwaves.

Figure 2:
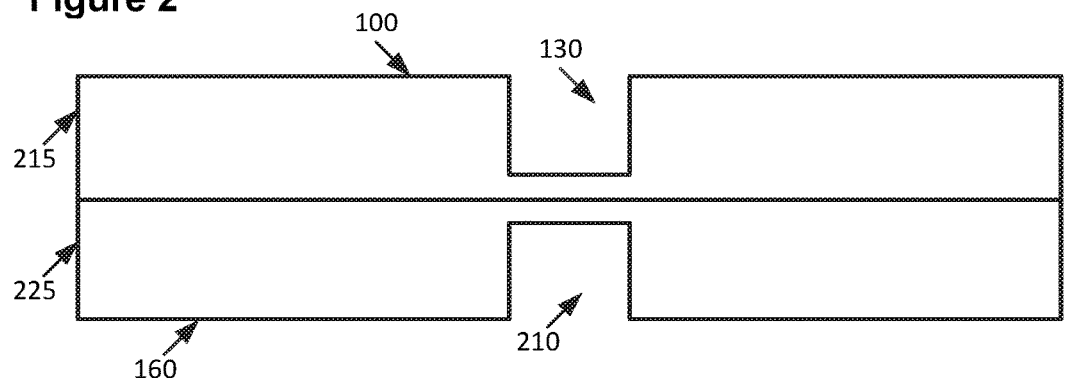
FIG. 2 shows an example laminate material according to an implementation of the disclosed subject matter.

FIG. 2 shows an example laminate material according to an implementation of the disclosed subject matter. The laminate material 100 may include an electrically active layer 215, which may be a piezoceramic, and an electrically passive layer 225, which may be a metal. The electrically active layer 215 and the electrically passive layer 225 may be bonded in any suitable manner. The laminate material 100 may be subdiced on both sides. The subdicing pattern used on both sides of the laminate material 100. For example, for a trench 130 created on a first side of the laminate material 100, there may be a corresponding trench 210 created on the opposite of the laminate material 100 from the trench 130. The trench 130 and the trench 210 may be aligned, or may be partially aligned, on the opposite surface of the laminate material 100. The trench 130 and the trench 210 may have the same depth, or may have different depths. For example, the trench 130 and the trench 210 may both have depths that are 40% of the thickness of the laminate material 100, leaving a portion of the laminate material 100 that is 20% of the thickness of the laminate material 100 in between the trench 130 and the trench 210.

The trenches 130 and 210 may have any suitable width. The minimum width of the trenches 130 and 210 may be based on, for example, the device or other process used to create the trenches 130 and 210. For example, the width of a trench 130 created with a dicing saw may be wider than a trench 130 created with laser ablation. The widths of the trenches 130 and 210 may be adjusted based on, for example, the distance between the flexures 120, the wavelengths of surface waves that propagate through the laminate material 100 when the flexures 120 vibrate, or any other suitable factor.

The trenches 130 and 210 may have any suitable cross-section. The cross-section of the trenches 130 and 210 may depend on the device or other process used to create the trenches 130 and 210. For example, the cross-section of a trench 130 created using a dicing saw may differ from the cross-section of a trench 130 created using laser ablation.

Figure 3:
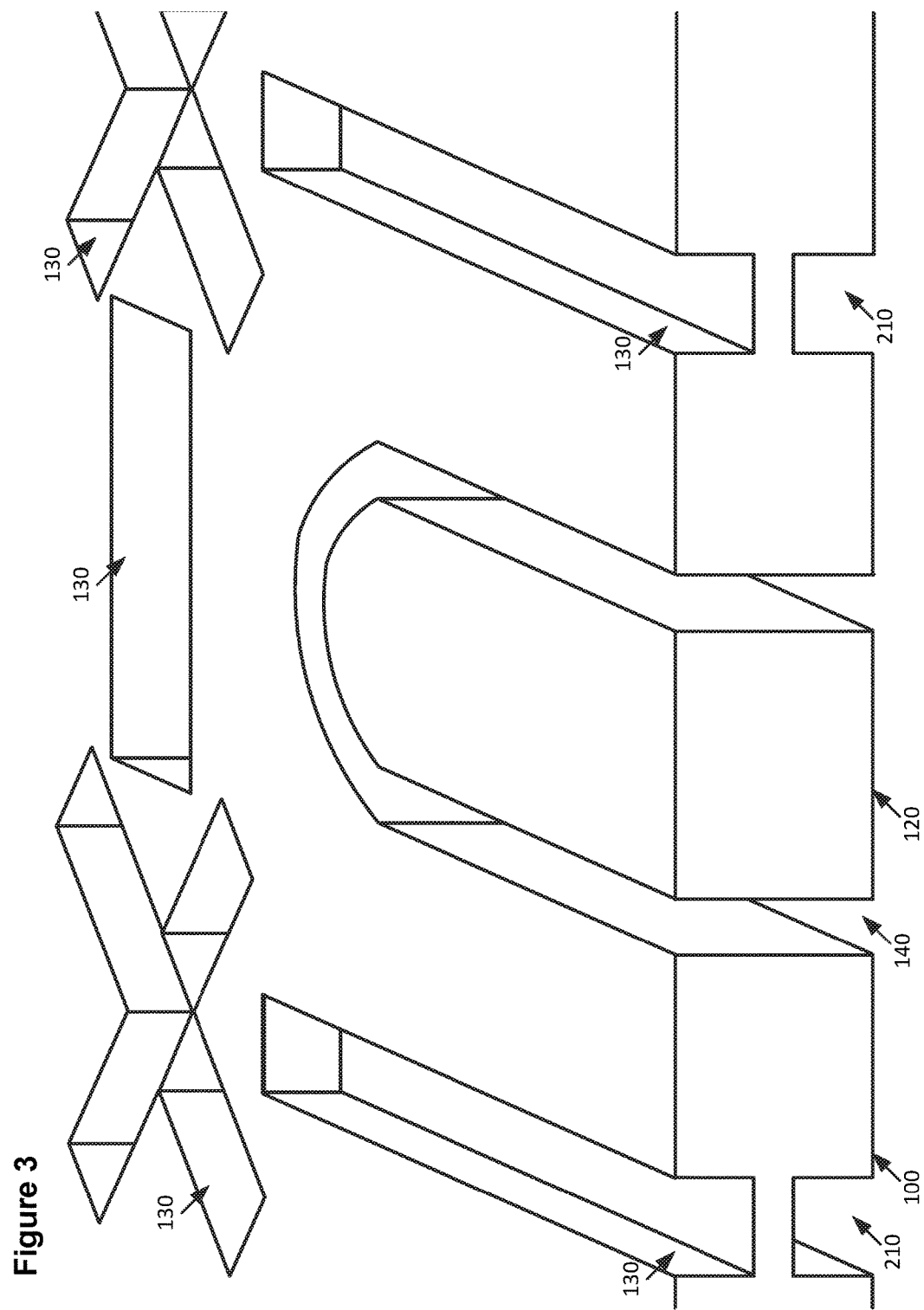
FIG. 3 shows an example laminate material according to an implementation of the disclosed subject matter.

FIG. 3 shows an example laminate material according to an implementation of the disclosed subject matter. The trenches 130 and 210 may go partially through the thickness of the laminate material 100. The gap 140 may go through the entire thickness of the laminate material 100, creating a free end of the flexure 120 that may move up and down relative to the surface of the laminate material 100. The trenches 130 and 210 may all have the same depths and widths, or may have varying depths and widths. For example, the trenches 130 used to form the disconnected squares may have different depths or widths than the trenches 130 used to form cross patterns at the corners of the disconnected squares.

Figure 4A:
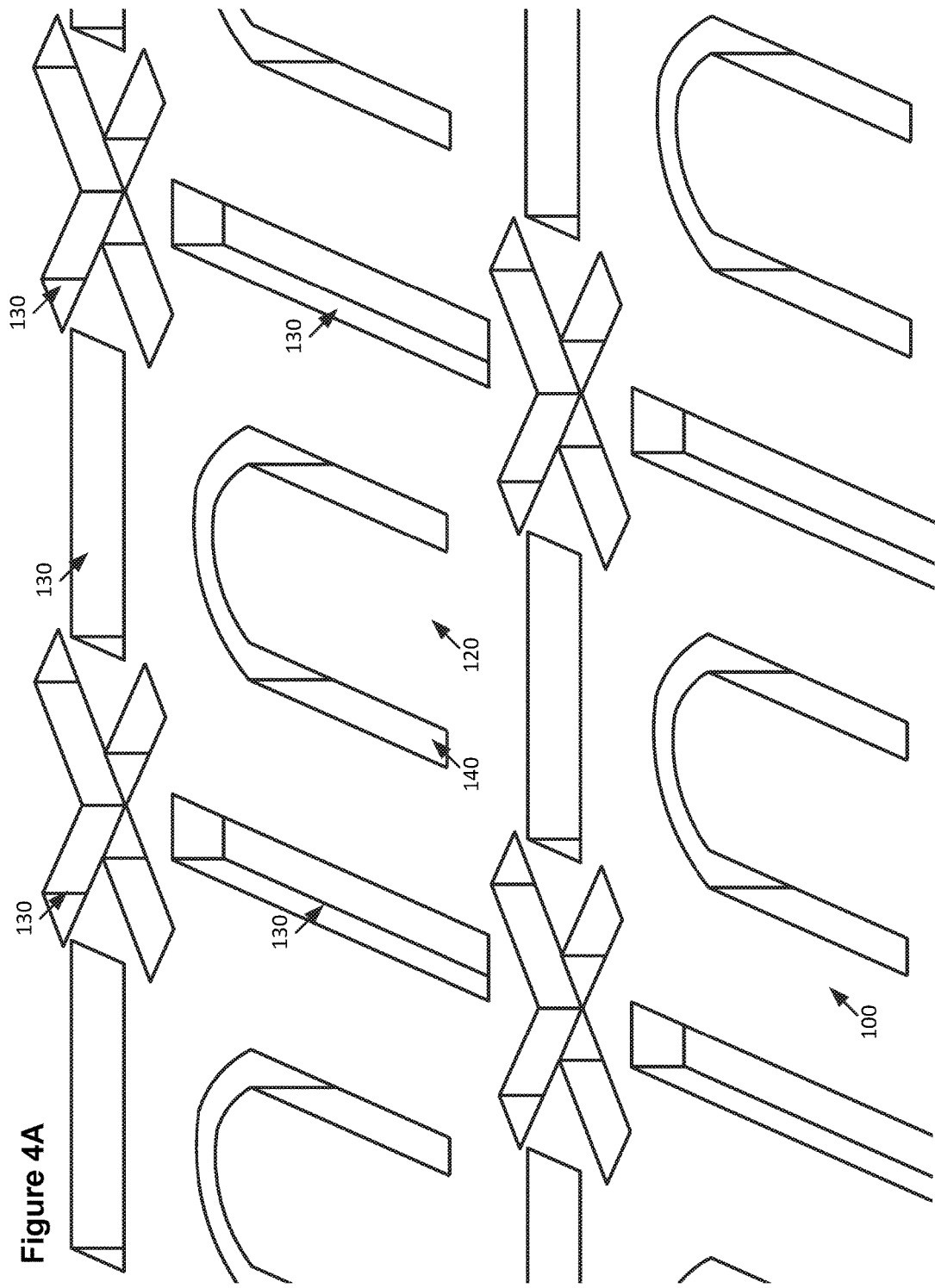
FIG. 4A shows an example laminate material according to an implementation of the disclosed subject matter.

FIG. 4A shows an example laminate material according to an implementation of the disclosed subject matter. A subdicing pattern may be repeated across the entirety of the laminate material 100. Each flexure 120 that is not next to the edge of the laminate material 100 may be in between four trenches 130, which may form a disconnected square around each flexure 120. The trenches 130 may be shared by the disconnected squares around neighboring flexures 120. Trenches 130 may form cross patterns, or X shapes, at each location where the disconnected squares would have corners, except at the edge of the laminate material 100. The subdicing pattern may be repeated on both sides of the laminate material 100. The trenches 130 may be of the same widths and depths, or may have varying widths and depths.

Figure 4B:
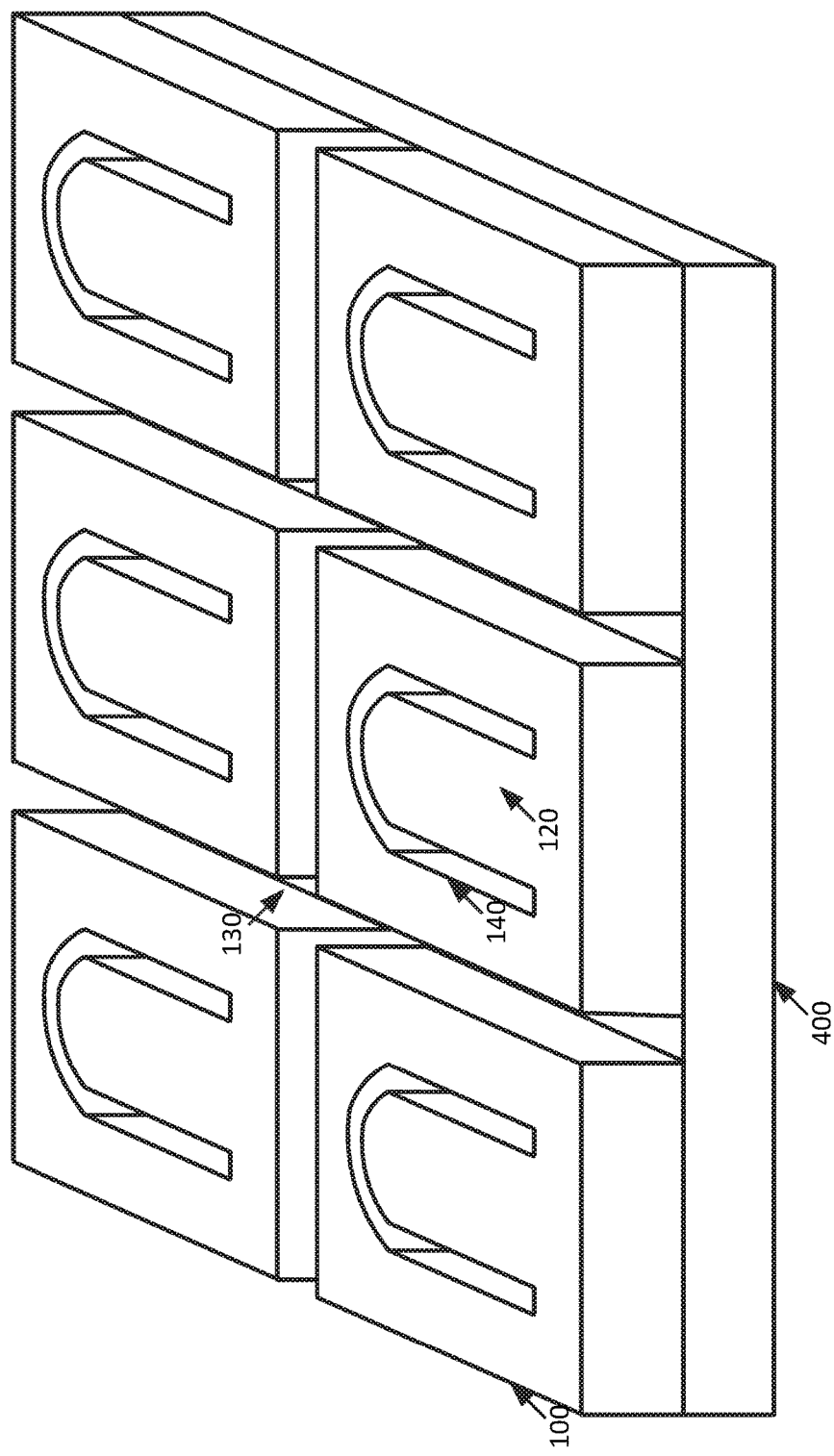
FIG. 4B shows an example laminate material according to an implementation of the disclosed subject matter.

FIG. 4B shows an example laminate material according to an implementation of the disclosed subject matter. The trenches 130 may remove the entirety of the thickness of the laminate material 100 around each of the flexures 120. This may result in the laminate material 100 being separated into several pieces, each having its own flexure 120. The trenches 130 may remove material from the laminate material 100 down to a substrate 400, which may be, for example, the top layer of a PCB.

Figure 5:
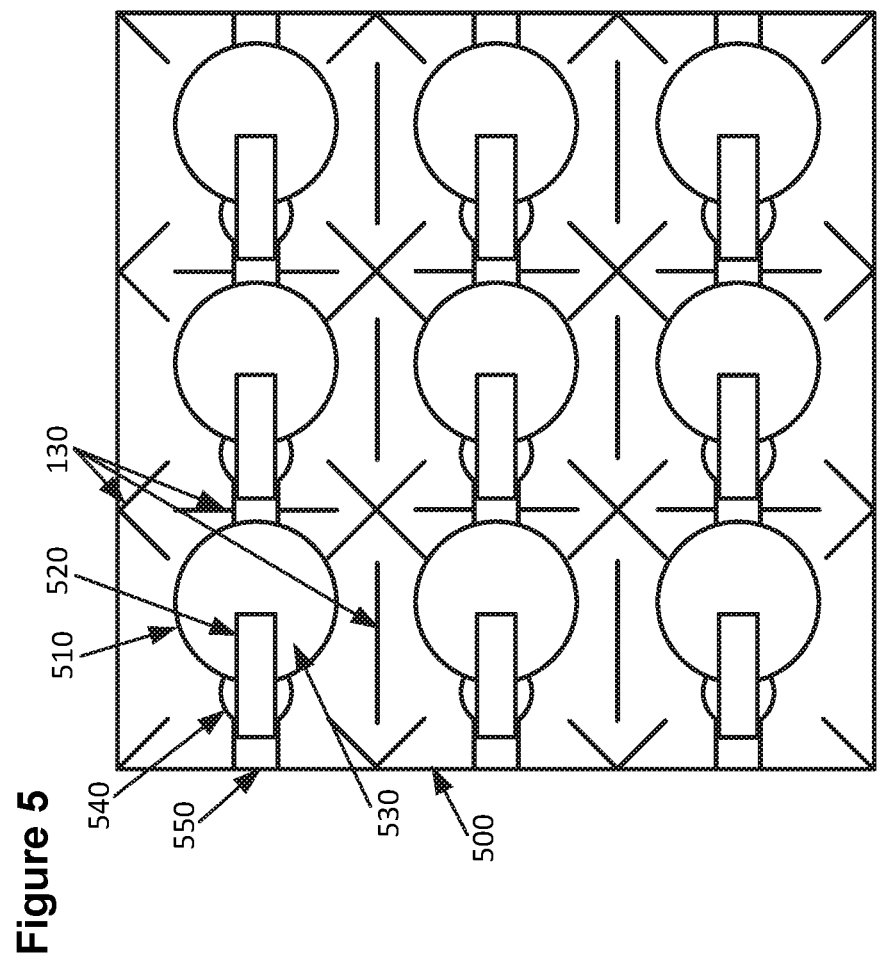
FIG. 5 shows an example substrate according to an implementation of the disclosed subject matter.

FIG. 5 shows an example substrate according to an implementation of the disclosed subject matter. A substrate 500 may include transducers 510. The transducers 510 may include a main cavity 530, a secondary cavity 540, a channel 550, and an electromechanically active device 520. The substrate 500 may be any suitable substrate, such as, for example, the top non-conductive layer of a PCB, or another material such as a metal, and may be in any suitable shape and of any suitable thickness. The first cavity 530 may be a cavity in the substrate 500, formed through any suitable additive or subtractive processes, and may be any suitable shape and any suitable depth. For example, the first cavity 530 may be circular. The second cavity 540 may be a cavity in the substrate 500 which may overlap the first cavity 530, and may be any suitable shape and any suitable depth. For example, the second cavity 540 may be a circular cavity of less depth than the first cavity 530, forming a first stair step at its intersection with the first cavity 530. The channel 550 may be a channel of any suitable width and depth, made in any suitable manner, which may run through the centers of the first cavity 530 and the second cavity 540. For example, the channel 550 may be made using a dicing saw cut of any suitable width through the first cavity 530 and the second cavity 540. The channel 550 may be shallower than the second cavity 540, so that the channel forms second stair step where it overlaps the second cavity 540. The second stair step may be in alignment with the first stair step. The channel 550 may run across a number of ultrasonic transducers 510, for example, if the ultrasonic transducers 510 are aligned on the substrate 500 so that a straight line cut from a dicing saw may pass through the centers of all of the first cavities 530 and second cavities 540 in a group of aligned transducers 510.

The electromechanically active device 520 may be any suitable electromechanically active device such as, for example, piezoelectric unimorph or bimorph which may use piezoceramic material bonded to an electrically inactive substrate. The electromechanically active device 520 may be any suitable shape, and may, be for example, a cantilever or flexure. The electromechanically active device 520 of the ultrasonic transducer 510 may be bonded to the substrate 500 at the first and second stair steps, with the free end of the electromechanically active device 520 projecting out over the bottom of the first cavity 530. The first and second stair steps may also include electrodes connected to vias which may go into the substrate 500, and may be bonded to electrodes of the electromechanically active device 520 using conductive epoxy. The top surface of the electromechanically active device 520 may be level with, or slightly below, the top surface of the substrate 500.

The substrate 500 may be subdiced. The substrate 500 may be subdiced before after the creation of the first cavities 530, second cavities 540, channels 550, and before or after the addition of the electromechanically active devices 520 to the substrate 500. The subdicing pattern may include any suitable number of trenches 130, which may be created through removal of portions of the material of the substrate 500. The portions of the material of the substrate 500 may be removed in any suitable manner to create the trenches 130, including, for example, through laser ablation, with a CNC mill or dicing saw, or with any other suitable device for removing portions of the material of the substrate 500. The trenches 130 may be created by removed material of the substrate 500 to any suitable depth, such as, for example, between 20% and 60% of the depth of the substrate 500.

The trenches 130 may be arranged in any suitable manner on the substrate 500 in accordance with any suitable subdicing pattern. For example, the trenches 130 may form disconnected squares around each of the transducers 510, with additional trenches 130 forming cross patterns, or X shapes, centered on the corners where the trenches 130 of the disconnected squares would meet were they were extended. The trenches 130 of the cross patterns may be angled relative to the trenches that form the disconnected squares. The subdicing pattern may be repeated for each of the transducer 510 of the substrate 500, with suitable modifications at the edges of the substrate 500. For example, at an edge of substrate 500, only half of the trenches 130 for a cross pattern may be used, forming a V shape. The trenches 130 may disrupt the propagation of surface waves through the substrate 500, which may prevent coupling of the transducers 510 when they are used as part of an array of transducers to generate ultrasonic soundwaves. In some implementations, only the top surface of the substrate 500 may be subdiced. For example, the substrate 500 may be the top layer of a multi-layer PCB, and the underside of the substrate 500 may not be accessible for subdicing. In some implementations, both the top and bottom surfaces of the substrate 500 may be subdiced. For example, the substrate 500 may be a separate piece of material, such as non-conductive material for a PCB, which may be subdiced on both sides before being attached as the top layer of a multi-layer PCB.

Figure 6A:
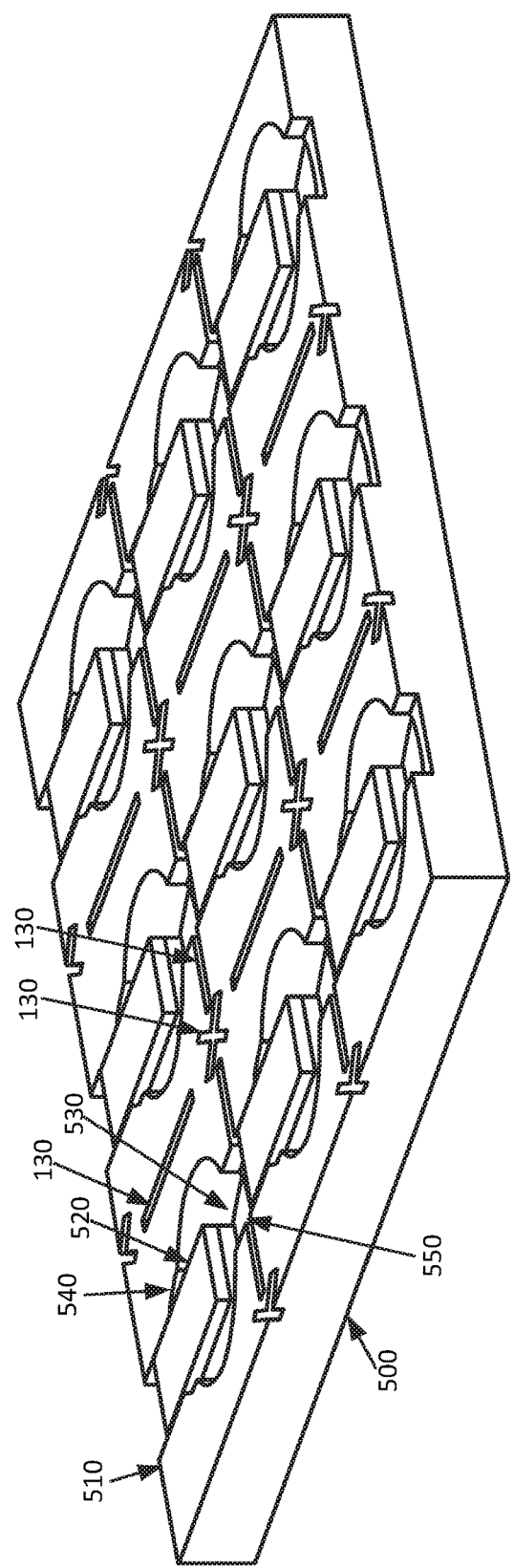
FIG. 6A shows an example substrate according to an implementation of the disclosed subject matter.

FIG. 6A shows an example substrate according to an implementation of the disclosed subject matter. The trenches 130 may go partially through the of the substrate 500. Some of the trenches 130 may run across the channels 550. When a trench 130 is deeper than a channel 550, either the trench 130 may be made to the same depth as the channel 550 where it intersects the channel 550, or may be cut into the channel 550. In some implementations, the substrate 500 may not include the channels 550, or the channels 550 and the trenches 130 may be positioned and sized so as to not intersect. The trenches 130 may all have the same depths and widths, or may have varying depths and widths. For example, the trenches 130 used to form the disconnected squares may have different depths or widths than the trenches 130 used to form cross patterns at the corners of the disconnected squares.

Figure 6B:
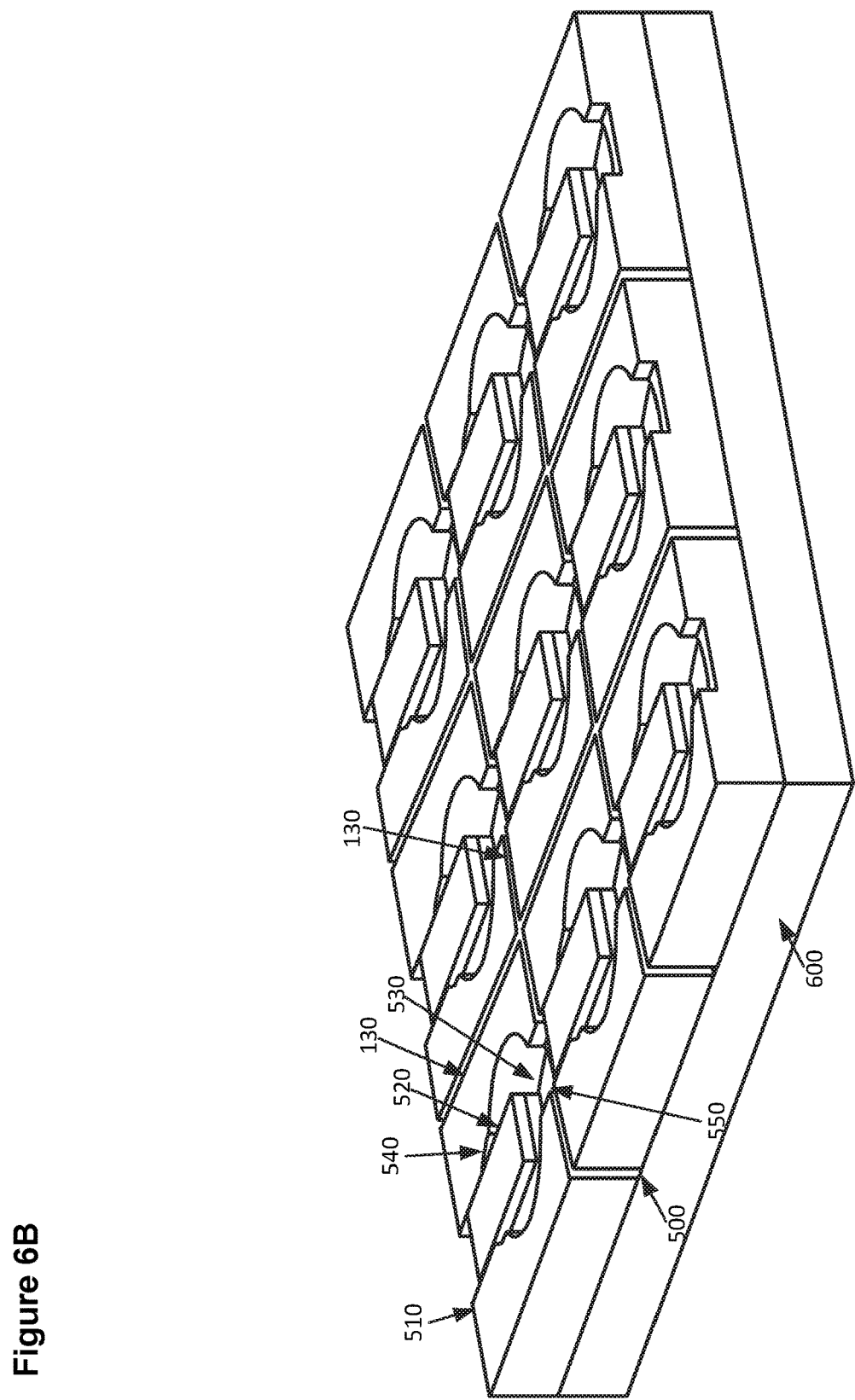
FIG. 6B shows an example substrate according to an implementation of the disclosed subject matter.

FIG. 6B shows an example substrate according to an implementation of the disclosed subject matter. The trenches 130 may be remove the entirety of the thickness of the substrate 500 around each transducer 510. This may result in the substrate 500 being separated into several pieces, each having its own transducer 510. The trenches 130 may remove material from the substrate 500 down to a material layer 600, which may be, for example, the top or second layer of a PCB.

The foregoing description, for purpose of explanation, has been described with reference to specific embodiments. However, the illustrative discussions above are not intended to be exhaustive or to limit embodiments of the disclosed subject matter to the precise forms disclosed. Many modifications and variations are possible in view of the above teachings. The embodiments were chosen and described in order to explain the principles of embodiments of the disclosed subject matter and their practical applications, to thereby enable others skilled in the art to utilize those embodiments as well as various embodiments with various modifications as may be suited to the particular use contemplated.

The invention claimed is:

1. A substrate comprising:
   two or more cavities in a material of the substrate;
   a trench disposed in between two of the two or more cavities, the trench comprising removal of a portion of the material of the substrate from the substrate; and
   a second trench, the second trench on an opposite surface of the substrate material from the trench.

2. The substrate of claim 1, wherein the second trench is at least partially aligned with the trench.

3. The substrate of claim 2, wherein the trench and the second trench each comprise a removal of material from the substrate to a depth of 20% to 60% of the thickness of the substrate, and wherein a total removal of material from the substrate in an area where the trench and the second trench are aligned is to a depth of less than 100% of the thickness of the substrate.

4. The substrate of claim 3, wherein a portion of the substrate with a thickness at least 20% of the thickness of the substrate remains disposed between the trench and the second trench.

5. The substrate of claim 1, wherein the trench comprises a removal of material from the substrate to a depth of 100% of the thickness of the substrate.

6. The substrate of claim 1, further comprising a plurality of additional trenches, each of the plurality of additional trenches disposed on the substrate between at least two of the two or more cavities.

7. The substrate of claim 6, wherein the trench and the plurality of additional trenches form a subdicing pattern on a first surface of the substrate.

8. The substrate of claim 7, wherein the subdicing pattern comprises trenches forming a disconnected square around each of the two or more cavities of substrate that is not at an edge of the substrate.

9. The substrate of claim 8, wherein the subdicing pattern further comprises trenches forming cross patterns at the corners of the disconnected squares.

10. The substrate of claim 7, wherein a second plurality of additional trenches form the subdicing pattern on a second surface of the substrate on the opposite side of the substrate from the first surface.

11. The substrate of claim 1, further comprising an electromechanically active device disposed in each of the two or more cavities, each electromechanically active device attached to the substrate.

12. The substrate of claim 11, wherein each cavity and electromechanically active device form an ultrasonic transducer.

13. The substrate of claim 1, wherein the substrate comprises material for a layer of printed circuit board (PCB).

14. The substrate of claim 1, wherein the substrate comprises a component of a transducer array.

* * * * *